(12) United States Patent
Kudo et al.

(10) Patent No.: US 6,728,283 B2
(45) Date of Patent: Apr. 27, 2004

(54) SEMICONDUCTOR LASER AND PHOTO MODULE USING THE SAME

(75) Inventors: Makoto Kudo, Hamura (JP); Kiyoshi Ouchi, Kodaira (JP); Tomoyoshi Mishima, Shiki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/287,519

(22) Filed: Nov. 5, 2002

(65) Prior Publication Data

US 2003/0086461 A1 May 8, 2003

(30) Foreign Application Priority Data

Nov. 8, 2001 (JP) ........................................ 2001-342861

(51) Int. Cl.$^7$ ................................................ H01S 5/00
(52) U.S. Cl. .......................................... 372/45; 372/43
(58) Field of Search ............................. 372/43, 46, 49; 257/85, 94, 96

(56) References Cited

U.S. PATENT DOCUMENTS

| | | | | |
|---|---|---|---|---|
| 5,751,014 A | * | 5/1998 | Nakatsu et al. | 257/25 |
| 5,767,535 A | * | 6/1998 | Bachem et al. | 257/96 |
| 5,818,073 A | * | 10/1998 | Ochi et al. | 257/85 |
| 5,900,642 A | * | 5/1999 | Nakatsu et al. | 257/25 |
| 2003/0006429 A1 | * | 1/2003 | Takahashi et al. | 257/200 |
| 2003/0053501 A1 | * | 3/2003 | Sekiya et al. | 372/43 |

FOREIGN PATENT DOCUMENTS

JP  2000-164990  11/1998

OTHER PUBLICATIONS

J. F. Klem, et al. "GaAsSb/InGaAs type–II quantum wells for long–wavelength lasers on GaAs substrates", Journal of vacuum Science and Technology, B18 (published in 2000), pp. 1605–1608.

* cited by examiner

Primary Examiner—Paul Ip
Assistant Examiner—Dung Nguyen
(74) Attorney, Agent, or Firm—Reed Smith LLP; Stanley P. Fisher, Esq.; Juan Carlos A. Marquez, Esq.

(57) ABSTRACT

A semiconductor laser which has an active layer of a lattice strain of less than 2% of a thickness mean on a GaAs substrate and can be used in a long wavelength band of 1.3 $\mu$m band or more and a photo module which uses the semiconductor laser are provided. The semiconductor laser device has a first semiconductor layer 5 and second semiconductor layers 4, the layer 5 and the layers 4 forming a type-II heterojunction structure, in which an energy of conduction band edge of said first conductor layer 5 is larger than the energy of conduction band of said second semiconductor layers 4. The device has third semiconductor layers 6 as barrier layers formed on both sides of said type-II heterojunction structure. In the device, the second semiconductor layers 4 are arranged on both sides of the first semiconductor layer 5 and the thickness of the first semiconductor layer 5 is set in such a degree of thickness that a wave function of an electron of a quantum well formed by making the second semiconductor layer well layers is coupled.

6 Claims, 9 Drawing Sheets

Prior Art

FIG.10

Prior Art

SEMICONDUCTOR LASER AND PHOTO MODULE USING THE SAME

BACKGROUND OF THE INVENTION

The present invention relates to a semiconductor laser which applies to and is suitable for optical communication and a photo module which uses the semiconductor laser.

A long-wavelength-band semiconductor laser which emits laser beam in a wavelength band of 1.3 μm or more is a principal device of optical communication, and, at present, is chiefly constituted by forming a compound semiconductor layer made of a material, such as InGaAsP, InAlGaAs, or InAsP, on an InP substrate. Because the InP substrate is expensive and the substrate size is difficult to increase, however, the semiconductor laser which uses the InP substrate was forced to become expensive.

On the contrary, a GaAs substrate is comparatively inexpensive and the substrate size is easy to increase. There was a problem, however, that the material which can be formed on the GaAs substrate is limited in terms of lattice strain and a semiconductor laser of high practicality in a long wavelength band is difficult to obtain. Because the GaAs substrate has the aforementioned features, however, the research and development of the long-wavelength-band semiconductor laser which uses GaAs in a substrate is advancing powerfully. Besides, if a long-wavelength-band vertical cavity surface emitting laser which uses the GaAs substrate can be realized, the laser can be combined with a GaAs/AlAs semiconductor multiple layer mirror and enables more miniaturization and realization of lower cost.

GaInNAs, GaAsSb, and InAs quantum dots are accepted as active layer materials which can be fabricated on the GaAs substrate and emit laser beam in a long wavelength which exceeds 1.3 μm. The lattice strain in each active layer material is approximately 2%, approximately 2.6%, and approximately 7% in order. Because the lattice strain (lattice-mismatch between the substrate and the active layer) is large as much as 2% or more in all active layer materials, such a problem that the life of a device is short may possibly occur.

On the other hand, there is an active layer which uses a type-II heterojunction structure as the active layer material which can be fabricated on the GaAs substrate in the same manner and emit laser beam in a long wavelength band which exceeds 1.3 μm. In a type-I heterojunction structure adopted in many usual semiconductor lasers, a semiconductor layer which forms a quantum well in a conduction band forms the quantum well also in a valence band and emission occurs in the same material. On the contrary, in the type-II, as described later, the layer adjacent to the semiconductor layer which forms the quantum well in the conduction band forms the quantum well in the valence band and the emission occurs between different materials. In the active layer which uses the type-II heterojunction structure, there is such an advantage that the degree of design freedom of energy band structure and lattice strain is high.

A laser device which uses the type-II heterojunction structure based on GaAsSb/InGaAs grown epitaxially on the GaAs substrate in the active layer is disclosed in a US document "Journal of Vacuum Science and Technology" B18 (published in 2000), on pages 1,605 to 1,608, for example. In this example, the active layer is fabricated using one layer of GaAsSb/InGaAs respectively.

Further, a laser device structure, in which a type-II superlattice constituted of the GaAsSb layer and the InGaAs layer which are thin as many as 1 to 10 molecular layers is used in the active layer, is disclosed in Japanese Patent Laid-open (Kokai) No. 2000-164990.

SUMMARY OF THE INVENTION

In the active layer which uses the type-II heterojunction structure, there is the aforementioned advantage that the degree of design freedom of the energy band structure is high, but there is the following problem and it was difficult to put the active layer to practical use.

Figure 9:
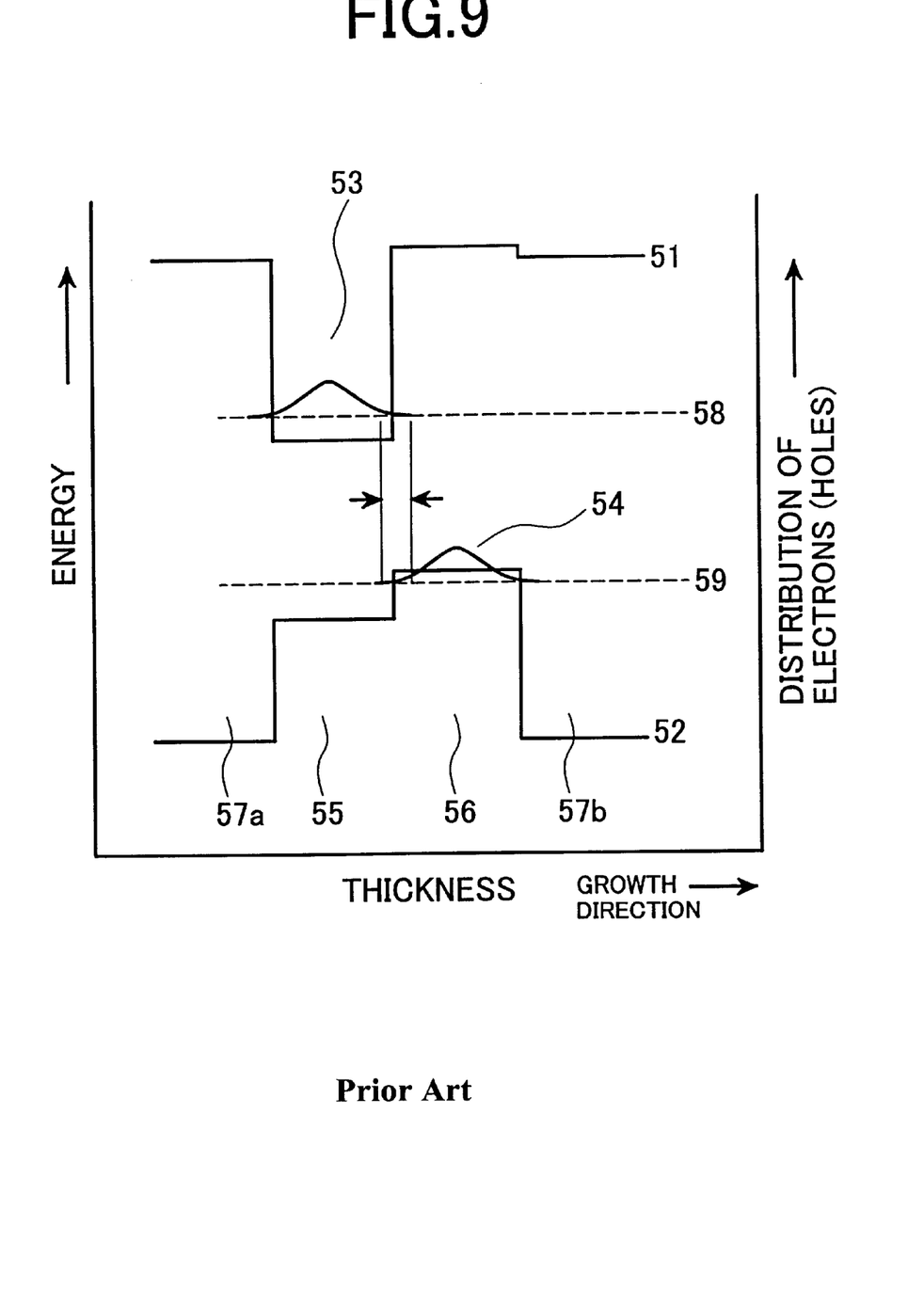
FIG. 9 is an energy band drawing for describing an example of a conventional semiconductor laser.

FIG. 9 shows the energy band structure in an example of the aforementioned laser having the type-II heterojunction structure in which one layer of the GaAsSb layer and the InGaAs layer is used respectively. The horizontal axis of FIG. 9 shows a semiconductor layer which is grown in the right direction from a substrate in order. With respect to the vertical axis, the right-side axis which shows distribution of electrons (holes) is used for a wave function and the left-side axis which shows energy is used for another function. A bottom barrier layer 57a, an InGaAs layer 55, a GaAsSb layer 56, and a top barrier layer 57b are formed from the substrate in order, and the InGaAs layer 55 and the GaAsSb layer 56 become active layers.

In FIG. 9, the energy band structure is constituted of an energy of conduction band edge 51 and an energy of valence band edge 52. A wave function 53 of an electron (a quantized electron's (hole's) energy state 58 of a conduction band) and a wave function 54 of a hole (a quantized electron's (hole's) energy state 59 of a valence band), which contribute to emission, overlap in the physical relationship of a vertical direction only for extremely in part (a range is shown in the drawing by an arrow), and the distribution of electrons (holes) of the overlapped part (rise of a wave function to the upper part) is small. Accordingly, there is a problem that emission efficiency is exceedingly low.

Figure 10:
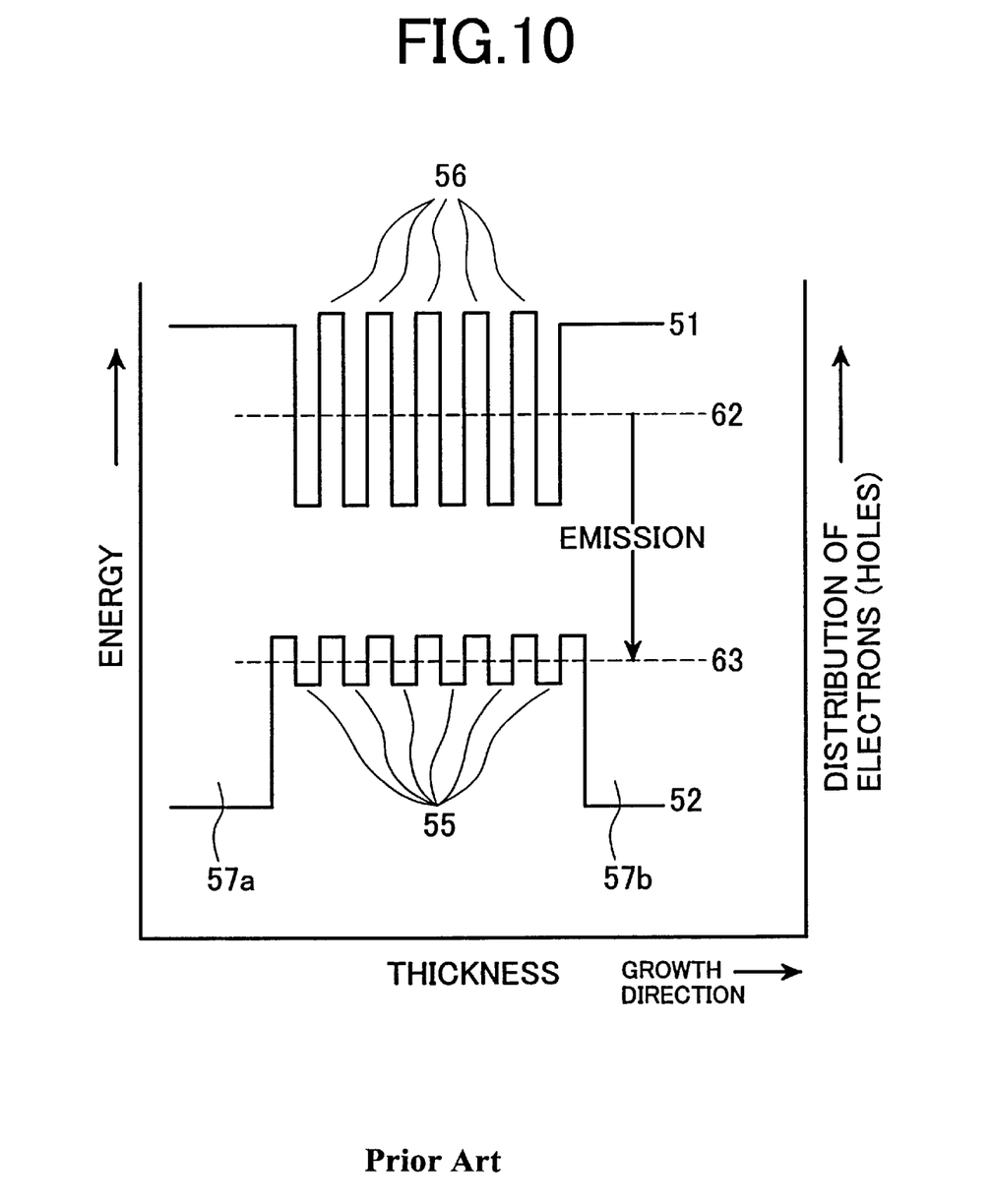
FIG. 10 is an energy band drawing for describing another example of the conventional semiconductor laser.

On the other hand, the aforementioned another laser device structure in which the type-II superlattice constituted of the GaAsSb layer and the InGaAs layer which are thin as many as 1 to 10 molecular layers becomes the energy band structure shown in FIG. 10. In this case, because the InGaAs layer 55 and the GaAsSb layer 56 are exceedingly thin, subbands 62, 63 are formed, and the structure becomes the energy band structure just like a type-I quantum well used in a usual quantum well laser. As a result, high emission efficiency is obtained.

In this case, however, the subband 62 at the side of the conduction band is formed at the side of higher energy than the energy of conduction band edge of the InGaSb layer 55 and the subband 63 at the side of the energy of valence band is formed at the side of lower energy than the energy of valence band of the GaAsSb layer 56. Accordingly, there is a problem that an emission wavelength is shifted to a short wavelength. To enable realization of a long wavelength, the In composition of InGaAs and the Sb composition of the GaAsSb layer need be increased. Because the increase of these types of composition results in the increase of lattice strain, however, the lattice strain which exceeds 2.3% need be introduced to realize the emission wavelength of the 1.3 μm band in this structure. In general, a device in which the lattice strain which exceeds 2% is introduced into an active layer may cause a problem in terms of life and reliability, and it is difficult to put the device to practical use.

An object of the present invention is to provide a semiconductor laser which has an active layer of a lattice strain of less than 2% on an average on a GaAs substrate and can be used in a long wavelength band of a 1.3 μm band or more and a photo module which uses the semiconductor laser.

To attain this and other objects, a semiconductor laser device of the present invention has a first semiconductor layer and second semiconductor layers, both of the first layer and the second layers becoming an active layer on a semiconductor substrate, and makes the first semiconductor layer and the second semiconductor layers adjacent to each other and laminates them. The semiconductor laser device forms a type-II heterojunction structure in which an energy of conduction band edge of the first semiconductor layer is larger than an energy of conduction band edge of the second semiconductor layers and an energy of valence band edge of the first semiconductor layer is larger than an energy of valence band edge of the second semiconductor layers, and has third semiconductor layers on top and bottom of the active layer, of which the energy of conduction band edge is larger than the second semiconductor layers and the energy of valence band edge is smaller than the second semiconductor layers. In the semiconductor laser device, the second semiconductor layers are arranged respectively sandwiching the first semiconductor layer on top and bottom of the first semiconductor layer, and the thickness of the first semiconductor layer is a degree of thickness in which a wave function of an electron of a quantum well formed at the side of a conduction band by making the second semiconductor layers well layers is coupled, and the first semiconductor layer is made thinner than each of the second semiconductor layers.

Figure 1:
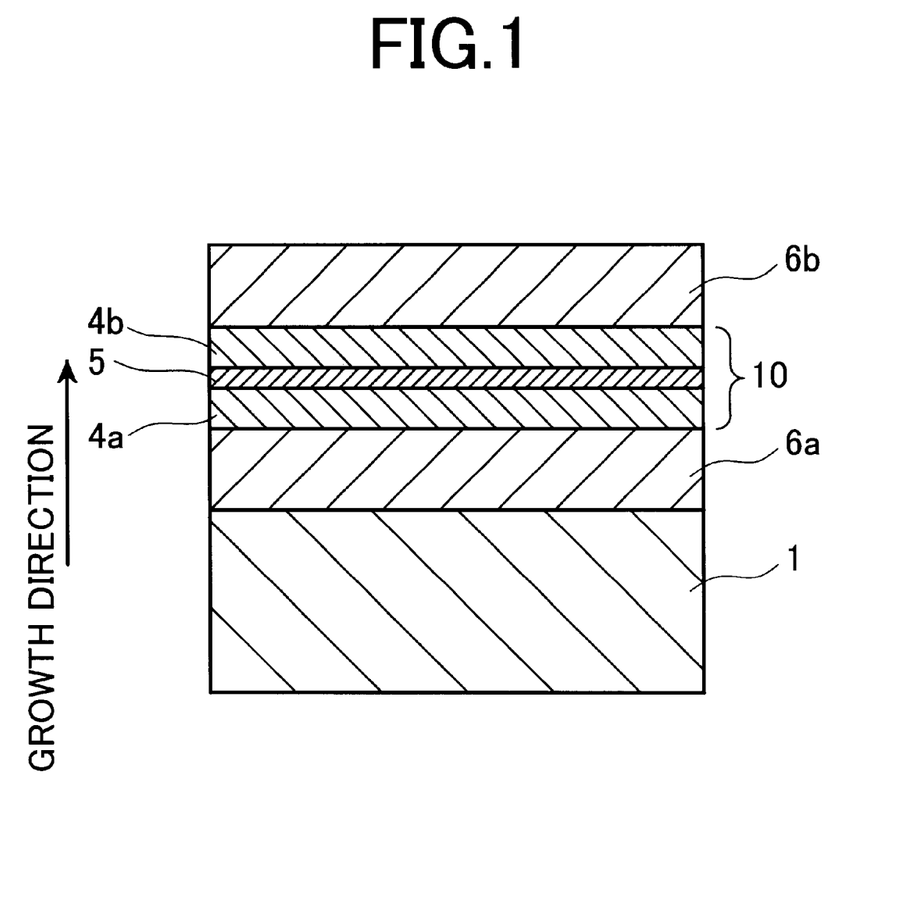
FIG. 1 is a sectional view for describing a basic configuration of a semiconductor laser according to the present invention.
Figure 2:
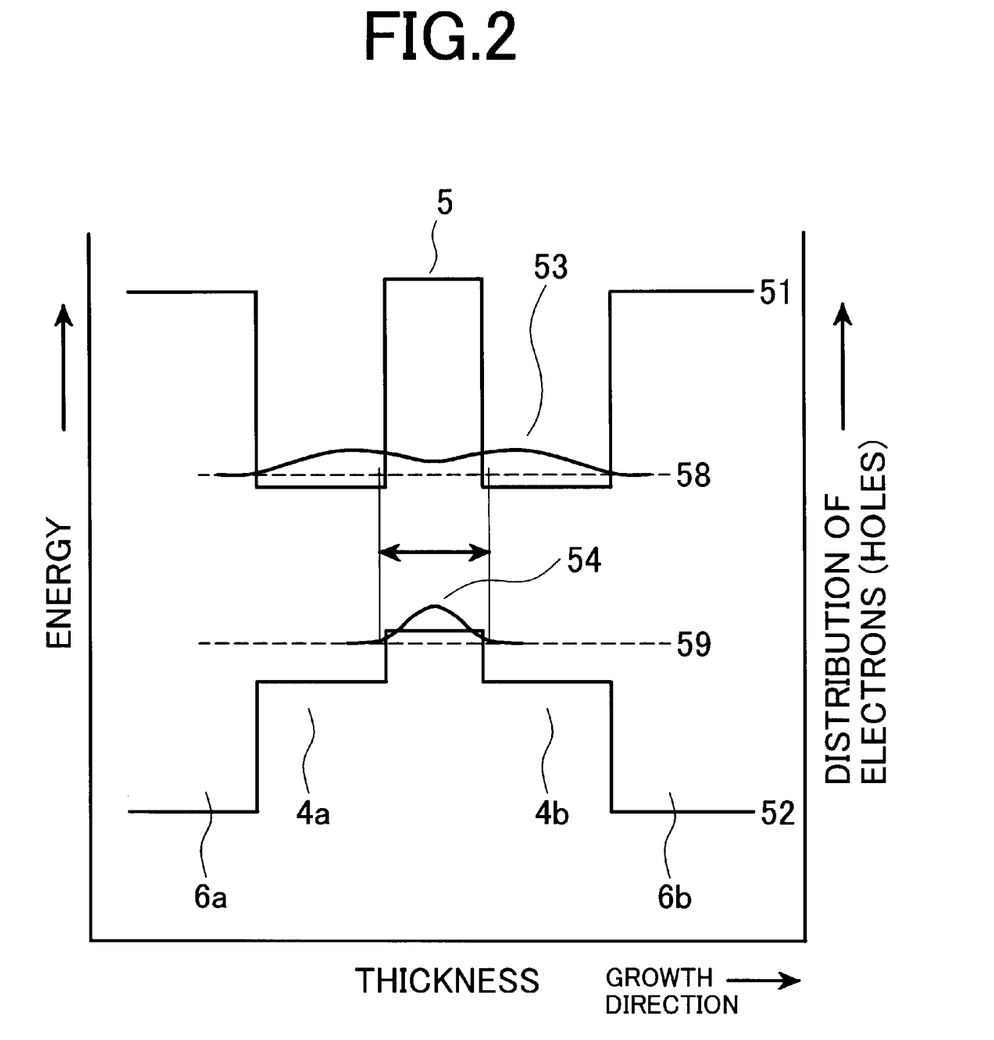
FIG. 2 is an energy band drawing of an active layer for describing the basic configuration of the semiconductor laser of the present invention.

FIG. 2 shows the energy band structure in the vicinity of the active layer of the aforementioned semiconductor laser. Here, as shown in the drawing by an arrow, because the growth direction of a multiple layer is from the left to the right as described previously, an expression of "on top and bottom of an active layer" corresponds to the left and right of the active layer in FIG. 2 (in FIG. 1, and FIGS. 4, 8 described later, the expression corresponds to top and bottom as shown in the drawings). FIG. 2 shows from the left in order that a bottom third semiconductor layer 6a, a bottom semiconductor layer 4a, first semiconductor layer 5, a top second semiconductor layer 4b, and a top third semiconductor layer 6b are arranged. The first semiconductor layer 5 and the second semiconductor layers 4a, 4b become active layers and the third semiconductor layers 6a, 6b operate as barrier layers.

The thickness of the first semiconductor layer 5 is set in a degree of thickness in which a wave function of an electron of a quantum well is coupled, that is, the thickness in which the wave function of the electron can be coupled. Accordingly, in FIG. 2, by coupling the wave functions of two quantum wells at the side of the conduction band, a wave function 53 in which the electron is made to exist at the side of the conduction band is formed in a distribution area (a range shown by an arrow) of a wave function 54 of a hole, and the low emission efficiency which was the problem of the conventional type-II heterojunction structure is improved. The specific thickness of the first semiconductor layer 5 is, for example, approximately 6 nm or less according to the combination and composition of a material. This example differs from the related art in which both the aforementioned first and second semiconductor layers are made extremely thin as many as 1 to 10 molecular layers in that only the first semiconductor layer 5 is made thin in this manner.

Here, the reason why the first semiconductor layer 5 is made thin instead of the second semiconductor layers 4 is described simply. In the type-II heterojunction structure in which the size relationship of energy was defined as described above, the first semiconductor layer 5 forms a quantum well in a valence band and the second semiconductor layers 4 form quantum wells in a conduction band. In general, because the change of an energy state when the thickness of the quantum well is changed is smaller in holes than electrons, the valence band is difficult to influence by a quantum effect. As described previously, because the realization of the short wavelength of an emission wavelength when a quantum well is made thin causes a problem, in the present invention, a layer which makes the first semiconductor layer 5 thin was selected so that the quantum well can be formed at the side of the valence band with a low degree of the realization of the short wavelength even if the quantum well is made thin. Here, if the thickness of the first semiconductor layer 5 is 3 nm or more, the realization of the short wavelength of the emission wavelength when the quantum well is made thin is suppressed in such a degree that will not cause any problem.

As a combination of typical materials, the aforementioned semiconductor laser device is formed on a GaAs substrate, the aforementioned first semiconductor layer 5 uses GaAsSb and the aforementioned second semiconductor layers 4 use GaInAs or GaInNAs.

To enable realization of a long wavelength, the Sb composition or In composition need to increase, but both types of the composition result in an increase of lattice strain. Because the increase of the lattice strain gives a serious effect on the reliability of a device, the lattice strain (lattice strain of a thickness mean) as the entire active layer can be set to less than 2% by selecting a layer which increases the thinner first semiconductor layer 5 as the layer which increases the Sb or In composition for enabling the realization of the long wavelength. That is, the low lattice strain as the entire active layer can be realized by making the lattice-mismatch between the semiconductor substrate 1 and the first semiconductor layer 5 greater than the lattice-mismatch between the semiconductor substrate 1 and each of the second semiconductor layers 4.

Besides, it is easily understood that the present invention can apply to the realization of the long wavelength of the type-II laser on another type of substrate as well as that of the laser in which the type-II heterojunction structure on the GaAs substrate is used in the active layer. For example, the present invention is effective even for enabling the long wavelength of the type-II heterojunction structure using the GaAsSb/InGaAs formed on the InP substrate. By using this art, the long wavelength laser which can be realized only on the more expensive GaSb substrate than the INP can be realized with little lattice strain on the InP substrate.

These and other objects and many of the attendant advantages of the invention will be readily appreciated as the same becomes better understood by reference to the following detailed description when considered in connection with the accompanying drawings.

DESCRIPTION OF PREFERRED EMBODIMENTS

A semiconductor laser and a photo module which uses the semiconductor laser according to the present invention are described below in further details with reference to the embodiments of the present invention shown in the drawings. Besides, identical symbols in FIG. 1, FIG. 2, FIG. 4, FIGS. 5A–5D, and FIG. 8 indicate identical articles or similar articles.

First of all, a wavelength assessment sample for examining an emission wavelength from an active layer having a type-II heterojunction structure according to the present invention and its emission efficiency is fabricated. The wavelength assessment sample is the basic configuration of an embodiment of the present invention and FIG. 1 shows the structure. In FIG. 1, 1 is a semi-insulating GaAs substrate, 10 is an active layer, 6a and 6b are an undoped GaAs bottom barrier layer and an undoped GaAs top barrier layer respectively which sandwich the active layer 10. Further, the active layer 10 is constituted of a GaAsSb layer 5 which is a central first semiconductor layer, a GaInAs layer 4a which is a bottom second semiconductor layer and a GaInAs layer 4b which is a top second semiconductor layer, both second semiconductor layers sandwich the GaAsSb layer.

In the fabrication of the wavelength assessment sample having such a structure, using the MBE (molecular beam epitaxy) method, at first, the undoped GaAs bottom barrier layer 6a was grown by 300 nm thick on the semi-insulating GaAs substrate 1, and subsequently, the active layer 10 constituted of the $Ga_{0.8}In_{0.2}As$ layer 4a of 6 nm thick, the $GaAs_{1-x}Sb_x$ layer 5 of 4 nm thick, and the $Ga_{0.8}In_{0.2}As$ layer 4b of 6 nm thick was grown, and then the undoped GaAs top barrier layer 6b was grown by 150 nm thick. Here, there are two types of the Sb composition x of 0.2 and 0.28. FIG. 2 shows the energy band structure of this sample.

Figure 3:
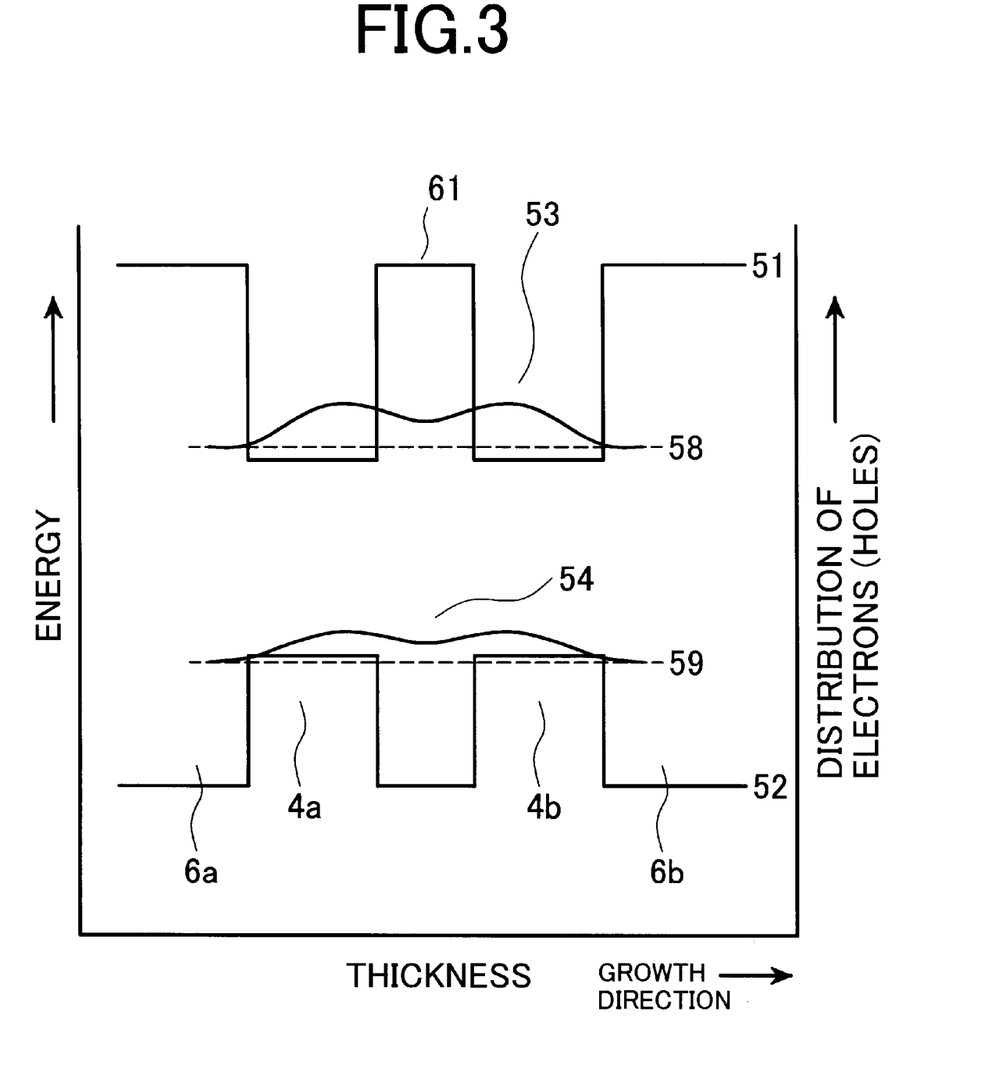
FIG. 3 is an energy band drawing of the active layer in the basic configuration prepared for comparison.

Besides, to assess the emission intensity of this embodiment, a comparison sample having the type-I quantum well structure adopted in a usual semiconductor laser is fabricated. The comparison sample has the structure in which the $GaAs_{1-x}Sb_x$ layer 5 of 4 nm thick in the structure of the above wavelength assessment sample is replaced with the GaAs layer of the same thickness. FIG. 3 shows the energy band structure of the comparing sample. FIG. 3 shows a GaAs layer 61 with which the center is replaced.

The optical characteristics of the wavelength assessment sample (multilayer wafer) obtained by a crystal growth using the MBE method were assessed using the photoluminescence method. As a result, when the Sb composition is 0.2, the emission wavelength at room temperatures is 1.17 μm, and when the Sb composition is 0.28, the emission wavelength is 1.3 μm. As a result, it was found that the structure of an active layer which can apply to the laser of the oscillation wavelength of 1.3 μm ought to be acceptable if the Sb composition is set to 0.28 in the aforementioned structure. Besides, the emission wavelength of the comparison sample was 1.00 μm.

Further, the obtained photoluminescence method was approximately 14 if the photoluminescence intensity of the comparison sample is 10. If it is considered that the sensitivity of a photoluminescence device differs with a wavelength, it can be said that both intensities are almost identical. Accordingly, it was shown that the problem that the emission efficiency of the related art is low according to the type-II structure of the present invention can be solved. This high emission efficiency is obtained when the electron wave functions of the two quantum wells at the side of the conduction band overlap and, therefore, there are ample electrons which contribute to the direct transition with the quantum well of the valence band.

Next, the lattice strain which is another problem of the conventional example is described. The lattice strain in the layer structure in which laser beam can be emitted in the aforementioned emission wavelength of 1.3 μm is 1.4% in the $Ga_{0.8}In_{0.2}As$ layer and 2.2% in the $GaAs_{0.72}Sb_{0.28}$ layer. The lattice strain of the $GaAs_{0.72}Sb_{0.28}$ layer is larger than 2%. Because the thickness is amply thin as much as 4 nm below a half of the critical layer thickness (approximately 8 nm), however, reliability will not deteriorate. Further, in this case, the lattice strain as the entire active layer 10, that is, the lattice strain of the thickness mean is set to 1.6% and this value is the minimum value in the material which emits laser beam in the emission wavelength of 1.3 μm on the GaAs substrate (as described in the prior art, the lattice strain is approximately 2% even in the GaInNAs active layer of a comparatively little lattice strain).

Accordingly, a laser device excellent in reliability was able to be fabricated by using the type-II heterojunction structure of the present invention. Here, the lattice strain of the thickness mean was obtained by dividing (the product of the thickness of a $Ga_{0.8}In_{0.2}As$ layer and a lattice strain)+the product of a $GaAs_{0.72}Sb_{0.28}$ layer and a lattice strain) by the total of the thickness of the $Ga_{0.8}In_{0.2}As$ layer and the $GaAs_{0.72}Sb_{0.28}$ layer).

Besides, the type-II heterojunction structure used GaInAs/GaAsSb as described above, but it is evident that the emission wavelength of 1.3 μm can be obtained with a lower lattice strain by using the GaInNAs/GaAsSb structure. Further, the relationship between the lattice strain and the emission wavelength was estimated when a content was changed in the type-II heterojunction structure constituted of GaInNAs/GaAsSb. As a result, when the content is set to $Ga_{0.8}In_{0.2}N_{0.01}As_{0.99}/GaAs_{0.7}Sb_{0.3}$, it was found that an active layer in which laser beam can be emitted in the 1.55 μm band in a small condition where the strain of the thickness mean is 1.5%.

Further, the thickness of the GaAsSb layer 5 was set to 4 nm as described above, but if the thickness is less than approximately 6 nm, sufficient emission efficiency is obtained. The thickness of the GaAsSb layer 5 can be set within the range which is 3 nm larger from the limit of the degree of realization of a short wavelength and smaller than approximately 8 nm of the critical thickness in terms of reliability. Preferably, as described above, the range is larger than 4 nm and smaller than 6 nm.

Further, the aforementioned In composition, Sb composition, or N composition, and the thickness of the first semiconductor layer and the thickness of the second semiconductor layer are one example. Another combination which can emit laser beam with good emission efficiency in the lattice strain of the thickness mean of less than 2% and in a desired wavelength (1.3 μm or 1.55 μm) may also be used.

Subsequently, a vertical cavity surface emitting laser constituted by adopting the structure shown in FIG. 1 is described in Embodiment 1 and an edge emitting laser is described in Embodiment 2.

<Embodiment 1>

Figure 4:
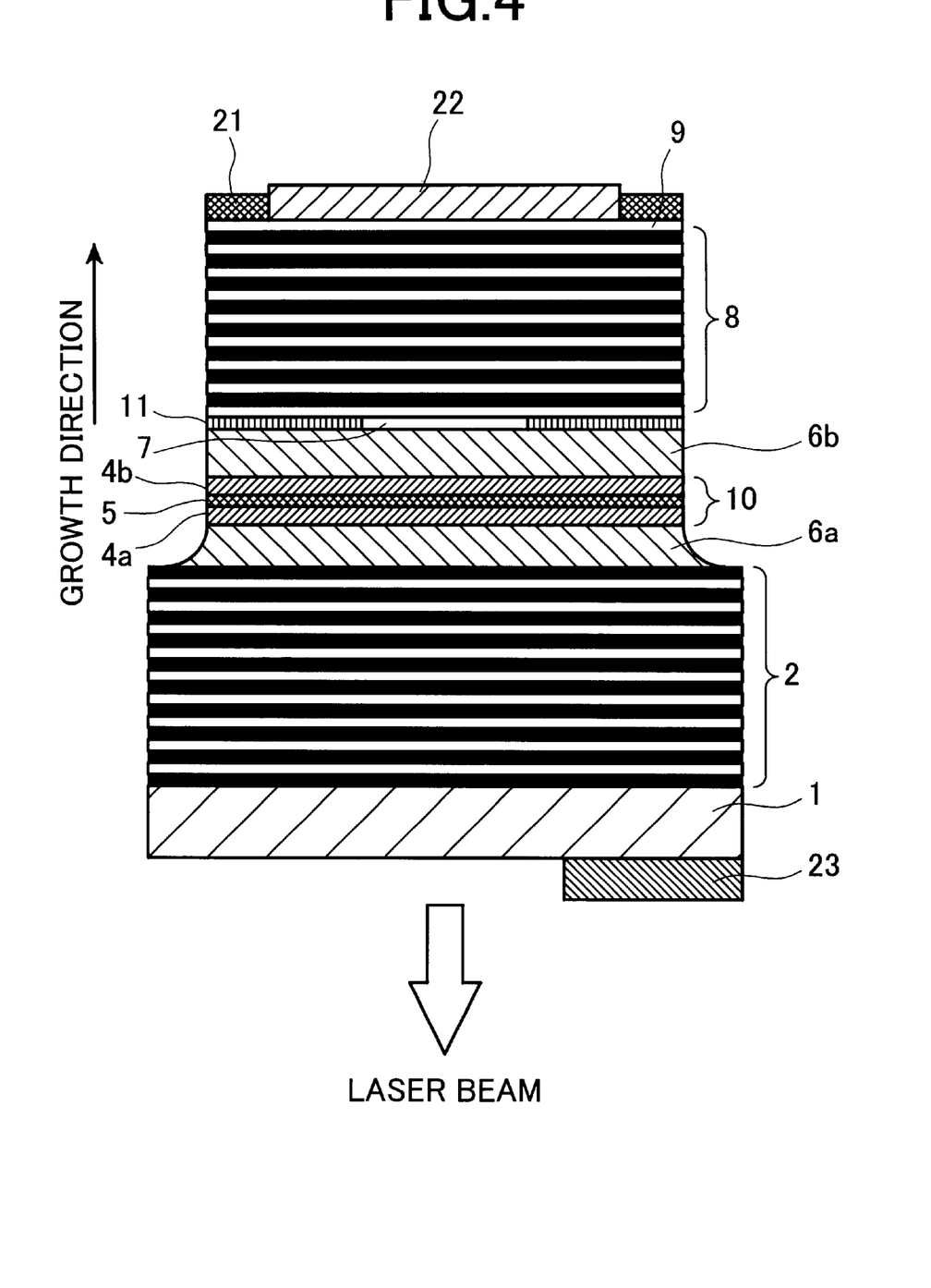
FIG. 4 is a sectional view for describing a first embodiment of the semiconductor laser of the present invention.

In FIG. 4, 2 is a bottom semiconductor multiple layer mirror arranged on an n-type GaAs substrate 1, 6a, 10, 6b are a bottom barrier layer, an active layer, and a bottom barrier layer having the same structure as described in FIG. 1 in each order, arranged on the bottom semiconductor multiple layer mirror 2, 7 is a current confinement layer for determining an area in which the current flows, arranged on the bottom barrier layer 6b, 11 is an insulating layer obtained by oxidizing the current confinement layer 7, 8 is a top semiconductor-multiple layer mirror arranged on the current confinement layer 7, 9 is a contact layer for electrical connection with the top semiconductor multiple layer mirror 8, 21 is an oxide film which protects the top of the contact layer 9, 22 is a p-side electrode which is brought into contact with the contact layer 9, and 23 is an n-side electrode which is brought into contact with the rear of the substrate 1. Further, the active layer 10 is constituted of a central GaAsSb layer 5 and respective bottom GaInAs layer 4a and top GaInAs layer 4b which sandwich the GaAsSb layer.

A typical formation method of the aforementioned vertical cavity surface emitting laser is described below. First, each semiconductor crystal layer is formed on all surfaces of a wafer that becomes the n-type GaAs substrate 1 by MBE equipment or MOCVD (metal organic chemical vapor deposition) equipment.

At first, the bottom semiconductor multiple layer mirror 2 constituted of an n-type $Al_{0.9}Ga_{0.1}As$/GaAs superlattice (doping density: $1 \times 10^{18}$ cm$^{-3}$) is laminated in 30 cycles on the n-type GaAs substrate 1 (doping density: $2 \times 10^{18}$ cm$^{-3}$) (the number of layers in the drawing is omitted and shown in approximately 10 cycles). The thickness of $Al_{0.9}Ga_{0.1}As$ and GaAs is set for the ¼ wavelength thickness (λ/4n: λ is a wavelength and n is a refractive index of a semiconductor) in each semiconductor.

Subsequently, the undoped GaAs bottom barrier layer 6a of ½ wavelength thickness, and the undoped $Ga_{0.8}In_{0.2}As$ layer of 6 nm in thickness, the undoped $GaAs_{0.72}Sb_{0.28}$ layer 5 of 4 nm thick, and the active layer 10 constituted of the $Ga_{0.8}In_{0.2}As$ layer 4b of 6 nm in thickness are laminated in order.

Then, the GaAs top barrier layer 6b of ½ wavelength thickness, the p-type AlGaAs current confinement layer 7 (doping density: $1 \times 10^{18}$ cm$^{-3}$, Ga content: 2%) of ¼ wavelength thickness, and the top semiconductor multiple layer mirror 8 constituted of the p-type $Al_{0.9}Ga_{0.1}As$/GaAs superlattice (doping density: $1 \times 10^{18}$ cm$^{-3}$) are laminated in 24 cycles. Each thickness in the $Al_{0.9}Ga_{0.1}As$ and GaAs layer is set to ¼ wavelength thickness in each semiconductor. Finally, the, contact layer 9 constituted of the p-type GaAs (doping density: $1 \times 10^{19}$ cm$^{-3}$) is formed in the ¼ wavelength thickness at the uppermost section.

A device is completed by applying the vertical cavity surface emitting laser fabrication process shown in FIG. 5A to FIG. 5D to the multilayer wafer fabricated as described above.

Figure 5A:
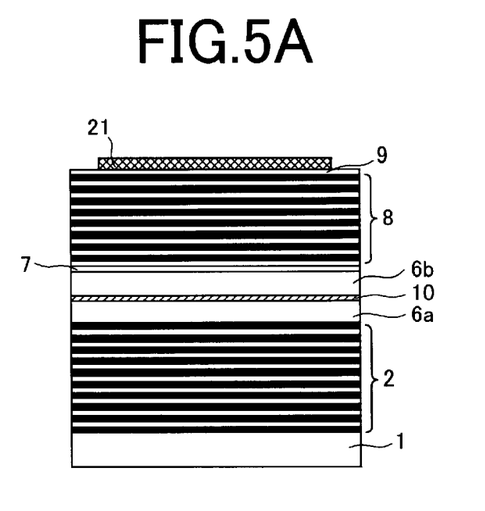
FIGS. 5A–5D are drawings for explaining a fabrication process of the first embodiment.
Figure 5B:
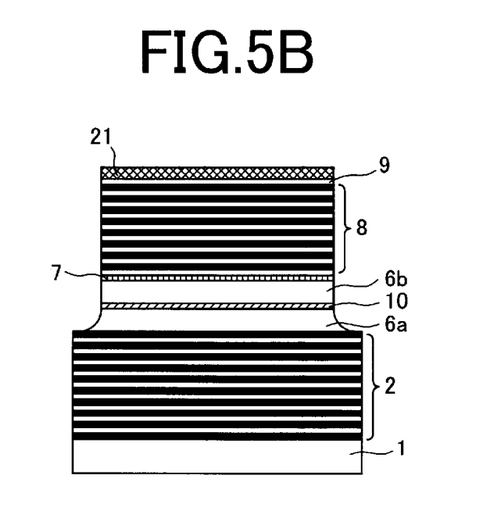

First, as shown in FIG. 5A, an oxide film (SiO$_2$) 21 is formed on all surfaces and a wafer is etching-worked circularly viewed from the surface of the wafer using this oxide film as a photoresist mask. After a resist is removed, as shown in FIG. 5B, a multilayer wafer is etching-worked as far as right under an active layer using the worked oxide film as the mask. The etching method can be even both wet etching and dry etching.

Figure 5C:
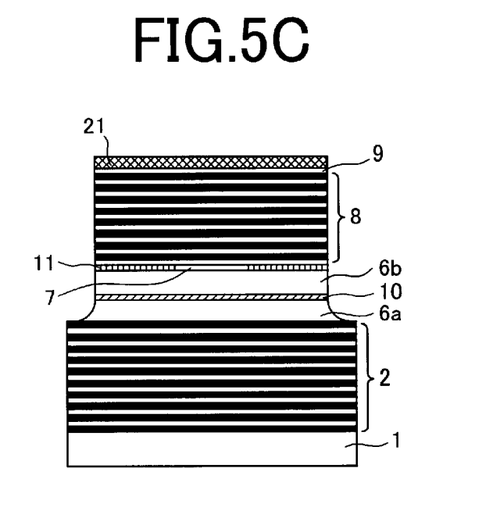
Figure 5D:
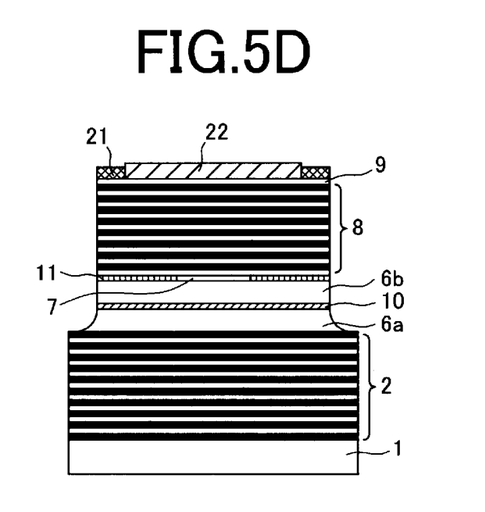

Subsequently, as shown in FIG. 5C, the current confinement layer 7 is selectively oxidized leaving an opening 7 from the side. The oxidized current confinement 7 becomes the $Al_xO_y$ insulating layer 11. Here, for the purpose of selective oxidation, the wafer is heated at approximately 400 degrees Celsius in the vapor atmosphere. Subsequently, a contact hole is formed on a part of the oxide film 21 by photolithography and etching, and the p-side electrode 22 is obtained by a lift-off process (FIG. 5D). Finally, a device is completed by forming the n-side electrode 23 on the rear.

A semiconductor laser device fabricated in this manner can operate in the oscillation wavelength of 1.3 μm. Further, because this semiconductor laser device is formed on an inexpensive GaAs substrate, low price can be realized. Further, because an active layer of little lattice strain is used, a semiconductor laser device excellent in reliability is obtained.

Figure 6:
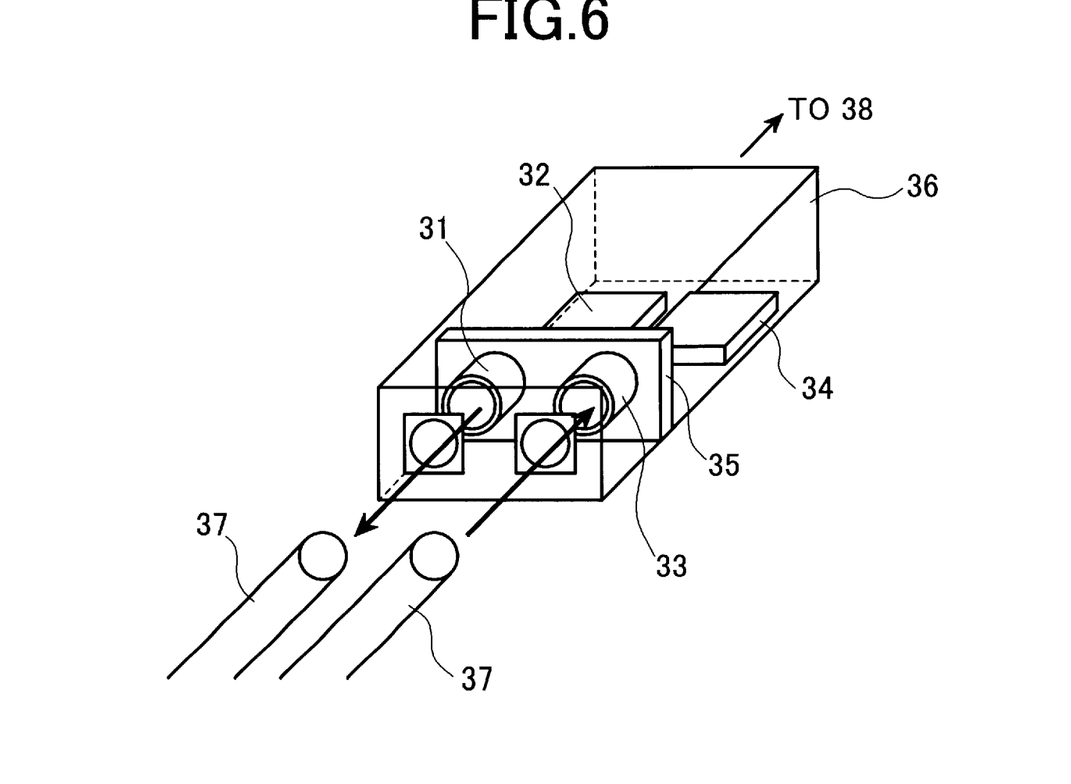
FIG. 6 is a perspective view for describing a photo module of the present invention using the semiconductor laser of the first embodiment.
Figure 7:
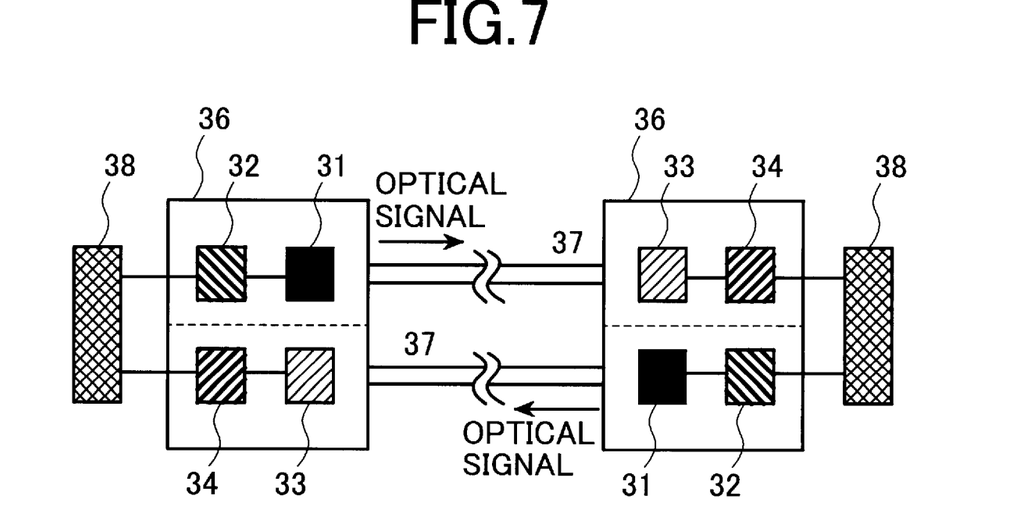
FIG. 7 is a block diagram for describing the photo module of the present invention using the semiconductor laser of the first embodiment.

Subsequently, FIG. 6 and FIG. 7 show a photo module which uses a semiconductor device 31 of the present invention. This photo module is constituted of the semiconductor laser device 31 of the present invention, a laser drive circuit 32 which drives the laser device 31, a light reception device 33 which receives an external optical signal, a light reception device drive circuit 34 which drives the light reception device 33, a device fixing section 35 for fixing the devices 31, 33, and a photo module package 36 which accommodates the aforementioned respective sections, and is used by an optical fiber 37 and an external drive circuit 38. Because this photo module uses a semiconductor laser on an inexpensive GaAs substrate, low price can be realized. Further, because an active layer of little lattice strain is used, a semiconductor laser device excellent in reliability can be obtained.

Besides, in this embodiment, needless to say, a semiconductor laser device of the 1.55 μm band and a photo module which uses the device can be fabricated by using an active layer which can emit laser beam in the 1.55 μm band, that is, the active layer which uses $Ga_{0.8}In_{0.2}N_{0.01}As_{0.99}$/$GaAs_{0.7}Sb_{0.3}$ type-II heterojunction structure.

Besides, in this embodiment, the barrier layers 6a, 6b uses GaAs. If a material which can confine electrons and holes in the active layer is used, the effect of the present invention will not be changed even if the material other than GaAs, such as GaNAs, GaInP, or AlGaAs is used.

<Embodiment 2>

Figure 8:
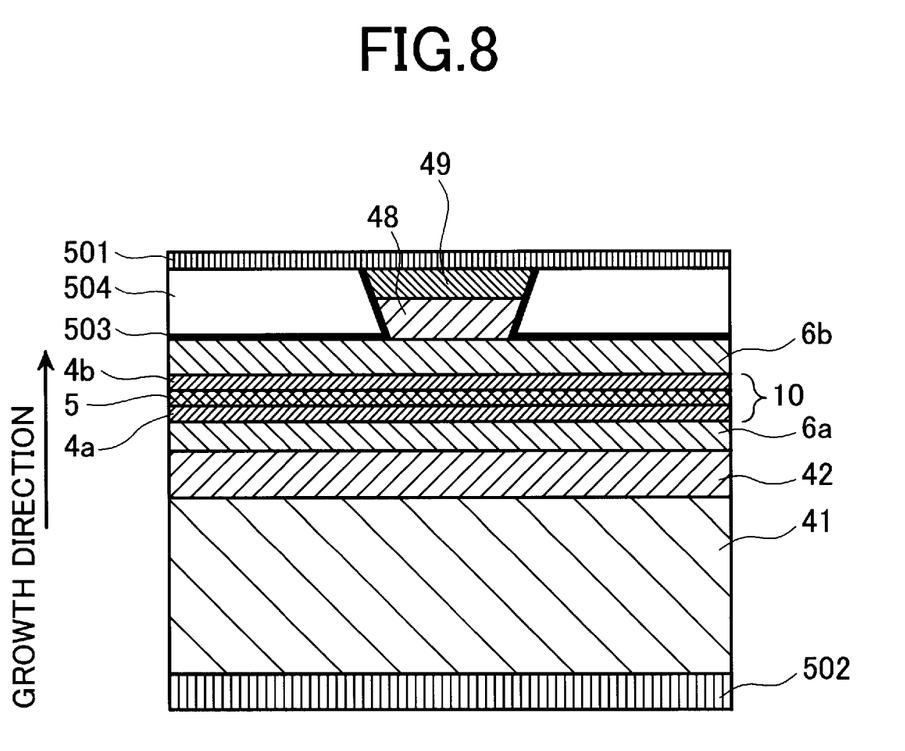
FIG. 8 is a sectional view for describing a second embodiment of the semiconductor laser of the present invention.

In FIG. 8, 41 is an n-type GaAs substrate, 42, 6a are a bottom clad layer and a bottom barrier layer arranged between the n-type GaAs substrate 41 and the active layer 10, 6b is a top barrier layer arranged on the active layer 10, 48 is a top clad layer having structure for fixing an area in which the current flows, arranged on the top barrier layer 6b, 49 is a contact layer for electrical connection with the top clad layer 48, 503, 504 are an oxide film and a polyimide resin in which the top clad layer 48 and the contact layer 49 are embedded respectively, 501 is a p-side electrode which is brought into contact with the contact layer 49 and is arranged on the polyimide resin 504, and 502 is an n-type electrode which is brought into contact with the rear of the substrate 41. Further, the active layer 10 is constituted of the central GaAsSb layer 5, and the bottom GaInAs layer 4a and the top GaInAs layer 4b both of which sandwich the layer 5.

A typical formation method of the aforementioned vertical cavity surface emitting laser is described below. First, each semiconductor crystal layer is formed on all surfaces of a wafer that becomes the n-type GaAs substrate 1 by MBE equipment or MOCVD.

At first, on the n-type GaAs substrate 41 (doping density: $1\times10^{18}$ cm$^{-3}$), 1.5 µm of the n-type $Al_{0.3}Ga_{0.7}As$ bottom clad later 42 (doping density: $1\times10^{18}$ cm$^{-3}$), 150 nm of the undoped GaAs bottom barrier layer 6a, 6 nm of the undoped $Ga_{0.8}In_{0.2}As$ layer 4a, 4 nm of the undoped $GaAs_{0.72}Sb_{0.28}$ layer 5, 6 nm of the undoped $Ga_{0.8}In_{0.2}As$ layer 4b, 150 nm of the undoped GaAs top barrier layer 6b, 1.5 µm of the p-type $Al_{0.3}Ga_{0.7}As$ top clad layer 48 (doping density: $1\times10^{18}$ cm$^{-3}$), and the p-type GaAs contact layer 49 (doping density: $1\times10^{19}$ cm$^{-3}$) are sequentially laminated.

First a stripe pattern of 50 µm width is formed for a multilayer wafer after lamination by photolithography and this is mesa-etched to the vicinity of the active layer 10. Subsequently, after the oxide film 503 is deposited on all surfaces and fattened with the polyimide resin 504, a contact hole is formed by the photolithography and etching and the p-side electrode 501 is deposited. Finally, an edge emitting laser device is completed by forming the n-side electrode 502 on the rear and forming an edge by cleavage.

A semiconductor laser device fabricated in this manner can operate in the oscillation wavelength of 1.3 µm. Further, because this semiconductor laser device is formed on an inexpensive GaAs substrate, low price can be realized. Further, because an active layer of little lattice strain is used, a semiconductor laser device excellent in reliability is obtained.

Even if this semiconductor laser is used, a photo module having the structure shown in FIG. 6 and FIG. 7 can be fabricated. Because this photo also uses a semiconductor laser on an inexpensive GaAs substrate, low cost can be realized. Further, because an active layer of little lattice strain is used, a photo module excellent in reliability can be obtained.

Besides, in this embodiment, needless to say, a semiconductor laser device of the 1.55 µm band and a photo module which uses the device can be fabricated by using an active layer which can emit laser beam in the 1.55 µm band, that is, the active layer which uses $Ga_{0.8}In_{0.2}N_{0.01}As_{0.99}$/$GaAs_{0.7}Sb_{0.3}$ type-II heterojunction structure.

A typical semiconductor laser device is shown in Embodiments 1, 2. Because the essence of the present invention consists in the active layer structure shown in the head, this laser device can also apply to, for example, a laser device of another structure, such as a laser of imbedded heterojunnction structure, regardless of the structure and type of the laser device.

According to the present invention, a semiconductor laser which has an active layer of a lattice strain of less than 2% on an average on a GaAs substrate and can be used in a long wavelength band of 1.3 µm band or more and a photo module which uses the semiconductor laser can be provided.

As a result, the realization of the high reliability and low price of the semiconductor laser and the photo module which uses the semiconductor laser can be compatible.

It is further understood by those skilled in the art that the foregoing description is a preferred embodiment of the disclosed device and that various changes and modifications may be made in the invention without departing from the spirit and scope thereof.

What is claimed is:

1. A semiconductor laser, comprising:

an active layer constituted of a first semiconductor layer and second semiconductor layers, the second semiconductor layers being brought into contact with said first semiconductor layer and being arranged on top and bottom of said first semiconductor layer; and barrier layers which are brought into contact with said active layer and are arranged on top and bottom of said active layer, wherein said active layer and said barrier layers are formed over a GaAs substrate, wherein said first semiconductor layer is a GaAsSb layer, and said second semiconductor layers are compound semiconductor layers selected from the group consisting of GaInAs layers and GaInNAs layers, wherein said first semiconductor layer is thicker than 3 nm and no thicker than 8 nm, wherein said first semiconductor layer is thinner than said second semiconductor layers, and wherein the semiconductor laser has an emission wavelength band equal to or greater than 1.3 µm.

2. The semiconductor laser according to claim 1, wherein the lattice-mismatch between said GaAs substrate: and said first semiconductor layer is larger than the lattice-mismatch between said GaAs substrate and each of said second semiconductor layers.

3. The semiconductor laser according to claim 1, wherein a vertical cavity surface emitting laser is constituted by comprising a first semiconductor multiple layer mirror arranged between said GaAs substrate and the bottom part of the barrier layers and a second semiconductor multiple layer mirror arranged on the top part of said barrier layers.

4. The semiconductor laser according to claim 1, wherein an edge emitting laser is constituted by comprising a first clad layer arranged between said GaAs and the bottom part of said barrier layers and a second clad layer arranged on the top part of said barrier layers.

5. The semiconductor laser according to claim 1, wherein said barrier layers are compound semiconductor layers selected from the group consisting of GaAs layers, GaNAs layers, GaInP layers and AlGaAs layers.

6. The semiconductor laser according to claim 1, wherein the active layer has a lattice strain of less than 2%.

* * * * *